(12) United States Patent
Otsuka et al.

(10) Patent No.: US 6,975,489 B2
(45) Date of Patent: Dec. 13, 2005

(54) CIRCUIT STRUCTURE AND SEMICONDUCTOR INTEGRATED CIRCUIT

(75) Inventors: Kanji Otsuka, 2-1074-38 Kohan, Higashiyamamto-shi, Tokyo (JP); Tadatomo Suga, 3-6-3, Higashinakano, Nakano-ku, Tokyo (JP); Tamotsu Usami, 2-38-4, Nishi-machi, Kokubunji-shi, Tokyo (JP)

(73) Assignees: Kanji Otsuka, Tokyo (JP); Tadatomo Suga, Tokyo (JP); Tamotsu Usami, Tokyo (JP); NEC Corporation, Tokyo (JP); Oki Electric Industry Co., Ltd., Tokyo (JP); Sanyo Electric Co., Ltd., Osaka (JP); SHARP Kabushiki Kaisha, Osaka (JP); Sony Corporatoin, Tokyo (JP); TOSHIBA Corporation, Tokyo (JP); Fujitsu Limited, Kanagawa (JP); Matsushita Electric Industrial Co., Ltd., Osaka (JP); Rohm Co., Ltd., Kyoto (JP); Renesas Technology Corp., Tokyo (JP)

( * ) Notice: Subject to any disclaimer, the term of this patent is extended or adjusted under 35 U.S.C. 154(b) by 210 days.

(21) Appl. No.: 10/348,896

(22) Filed: Jan. 23, 2003

(65) Prior Publication Data

US 2003/0184311 A1 Oct. 2, 2003

(30) Foreign Application Priority Data

Jan. 24, 2002 (JP) .................................... 2002-015753

(51) Int. Cl.$^7$ .................................................. H01G 2/12
(52) U.S. Cl. ............................. 361/15; 361/16; 361/17
(58) Field of Search ............ 361/15–17; 365/227–229; 710/33; 257/662, 664

(56) References Cited

U.S. PATENT DOCUMENTS

2001/0013075 A1 * 8/2001 Otsuka et al. ................ 710/33

* cited by examiner

Primary Examiner—Douglas W. Owens
(74) Attorney, Agent, or Firm—Young & Thompson

(57) ABSTRACT

A bypass capacitor having a given capacitance is arranged on the power/ground line adjacently to a driver circuit in a chip to reduce an effect of transient phenomenon at switching. The capacitance of the bypass capacitor is preset so as to be larger than a parasitic capacitance of the driver circuit to prevent the characteristic impedance of the power/ground line from being higher than the characteristic impedance of internal wiring.

30 Claims, 9 Drawing Sheets

MODEL IN WHICH WATER SOURCE PIPE IS THICKER THAN SUPPLY PIPE

CIRCUIT STRUCTURE AND SEMICONDUCTOR INTEGRATED CIRCUIT

BACKGROUND OF THE INVENTION

1. Field of the Invention

The present invention relates to a circuit structure for use in an electronic circuit such as a logical circuit operating at a high speed and a memory, and in particular to a circuit structure of a semiconductor integrated circuit.

2. Related Background Art

A semiconductor integrated circuit of the type described generally includes a logical circuit or a memory formed in a semiconductor chip. With a demand for digitalization in recent years, a request is increased for digital semiconductor integrated circuit operating at a high speed in a GHz band. The digital semiconductor integrated circuit generally includes a large number of transistors. In this event, each transistor is connected to a power supply for supplying electric energy and to a ground which discharges the supplied energy, thereby forming a transistor circuit.

While such a transistor circuit operates as an on-off switch or a gate circuit, no signal is sent from the transistor even if the transistor is turned on unless the power source supplies the electric energy.

Considering the transistor gate circuit here, the gate circuit is instantly put into the on-state. If the on-resistance is low, such a phenomenon that the wiring is incapable of supplying electric charges occurs when the connected power supply attempts to supply electric energy (electric charges). It will be described later in detail why the wiring is incapable of supplying the electric energy. Likening the power/ground wiring to a transmission line and assuming its characteristic impedance is 50 Ω, if the on-resistance of the transistor gate circuit is lower than the characteristic impedance such as 15 Ω, the wiring is incapable of supplying the electric charges. Fortunately, the characteristic impedance of a signal line is 50 Ω or higher in many cases. Consequently, a problem of failure in supply can be avoided. It is necessary, however, to cope with an instant change for supplying charges to a transistor parasitic capacitor. At any rate, it is required to make a pipe for supplying charges thick, namely, to adopt a method and a structure for lowering the power/ground characteristic impedance. Therefore, the inventors of the present invention has proposed a method and a circuit structure for lowering the power/ground characteristic impedance in Japanese Unexamined Patent Publication (JP-A) No. 2000-174505.

Further, if a switching operation of the transistor circuit becomes faster, an inductance against a sharp increase of current can not be ignored with the above-mentioned problem. Even if the power/ground characteristic impedance is lower than that of the signal line, it cannot catch up with rapid opening of a transistor gate circuit and a parasitic capacitance charge due to the parasitic inductance of the power/ground wiring. Therefore, a method and a structure for lowering the parasitic inductance are necessary.

Moreover, signal energy (charge quantity) determining a reception is insufficient until charging all the capacitors in the receiving transistor gate is completed with the current controlled by on-resistance. This causes an operation delay of the receiving transistor itself. As a result, current of the power supply continues to flow during the time.

In this manner, a state of disabled smooth control of switching in the transistor gate circuit becomes prominent in a digital circuit of the GHz band due to rate controlling caused by a supply capacity of the power/ground.

SUMMARY OF THE INVENTION

It is therefore an object of the present invention to provide a circuit structure and a semiconductor integrated circuit which are capable of securing a sufficient charge supply capacity of the power/ground so as to prevent the characteristic of the transistor gate circuit from being suppressed even if a fast operation is required.

According to a first aspect of the present invention, there is provided a circuit structure including a driver circuit and a power/ground line in a chip, wherein the power/ground line is connected to a capacitance element having a predetermined capacitance as an power-ground connection circuit so as to be adjacent to the driver circuit.

In this arrangement, the predetermined capacitance is larger than the parasitic capacitance of the driver circuit or the capacitance element having the predetermined capacitance is connected to the driver circuit so as to be complementary to the capacitance element of the driver circuit in operation.

The predetermined capacitance only need be equivalent to or larger than at least the stored charges of the driver circuit or total parasitic capacitance of the circuitry concerned.

Further, preferably the capacitance element comprises at least one of pn diffusion capacitor (junction capacitor) and electrode capacitor (storage capacitor).

According to another aspect of the present invention, there is provided a circuit structure further comprising a configuration in which a unit circuit including a transistor is connected to the power/ground line in a chip, wherein characteristic impedance of the power/ground line is lower than characteristic impedance of a signal transmission line for sending a signal through the driver circuit.

According to still another aspect of the present invention, there is provided a semiconductor integrated circuit having a unit circuit group comprising a plurality of unit circuits including transistors and a power/ground wiring portion for supplying power to the unit circuit group in a chip wherein the power/ground wiring portion has a capacitance adjustment portion in a position just before a branch of the unit circuit group.

The capacitance adjustment portion may be a wiring portion configured in such a way that the capacitance is larger than that of the unit circuit group.

On the other hand, the power/ground wiring portion has at least one bypass capacitor and the bypass capacitor of the power/ground wiring portion is preset so as not to be larger than (receiving end gate capacitance+its wiring capacitance)/(the number of units).

Further, when a single bypass capacitor is embedded in the unit circuit group, its capacitance $C_T$ is expressed by the following on condition that N is the number of units:

$$C_T \leq a \times N \times (\text{receiving end gate capacitance} + \text{its wiring capacitance}))$$

where a is a coefficient equivalent to an execution access determined on the ground that simultaneous access is not performed and a<1.

Specifically, the capacitance $C_T$ of the bypass capacitor is expressed by the following on condition that the receiving end gate capacitance is b fF and its wiring capacitance is c fF:

$$C_T \leq a \times N \times (b+c) fF$$

where the case of N=1 is included.

Each of the units forming the unit circuit group can be a memory including a plurality of storage memory cells. In this case, the capacitance $C_T$ of the bypass capacitor is preset so as to be larger than a cell capacitance of each memory cell.

In this case, the number of units N is preferably within a range of 1 to 10.

Specifically, the capacitance CT of the bypass capacitor is selected so as to be several times larger than the cell capacitance of each memory cell.

The bypass capacitor can be arranged for every unit circuit or as many bypass capacitors as 1/(the number of the unit circuits) can be arranged in a chip.

According to still another aspect of the present invention, there is provided a semiconductor integrated circuit wherein fine connection pads are arranged on the whole area of the chip and they are drawn out as power/ground pads alternately, while the bypass capacitor comprises capacitor groups made of the same semiconductor material in a bumpless flip chip connection (bumpless superconnect) and these capacitor groups are connected to the power/ground pads.

The fine connection pads are arranged in two lines around the chip and these pads form signal and ground pair pads.

In the meantime, the bumpless flip chip connection pitch is 10 μm or smaller in the arrangement.

The bumpless flip chips may be arranged on almost whole area of the chip.

Preferably, the pad has a signal pad connected to external wiring and a driver circuit connected thereto for driving a load of a receiver of another chip and the bypass capacitor connecting to the driver circuit connected through the signal pad concerned is larger than the internal circuit capacitor.

In this instance, preferably the bypass capacitor is arranged in one of a free space around the chip, a capacitor substrate, and an outer region of the signal pad and the signal pad is not arranged in the central portion of the chip, Moreover, the capacitor can be formed on a capacitor substrate made of different material from that of the chip. In this instance, the capacitor substrate is one of an SOI capacitor substrate, a capacitor embedded ceramic substrate (thin-film wiring) having almost the same area (size) as for the intra-chip capacitor, and a capacitor embedded plastic thin-film wiring substrate.

In this condition, the capacitor is formed as a larger capacitor by decreasing a degree of division (in some cases, a solid capacitor structure). On the other hand, each capacitor may be provided with more taking-out electrodes than the capacitors.

In the present invention, a DC resistor can be inserted just before an output transistor in order to reduce instant spike current due to a parasitic capacitance charge caused by a depletion layer of the output transistor.

In this case, preferably the total of the power/ground characteristic impedance and series resistance is equal to or smaller than the signal line characteristic impedance.

DESCRIPTION OF THE PREFERRED EMBODIMENTS

Figure 1:
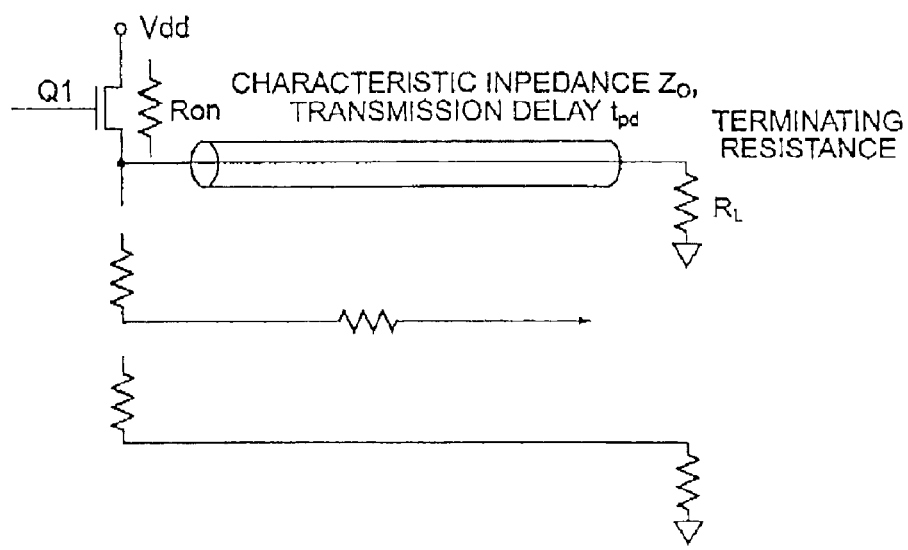
FIG. 1 is a diagram showing a circuit structure for explaining a principle of the present invention.

Before describing a circuit structure and a semiconductor integrated circuit according to embodiments of the present invention, a principle of the present invention will be described to simplify an understanding of the present invention.

A power/ground source is generally positioned outside a chip and a delay caused by long wiring leads to missing a charge supply when a transistor is turned on. This is a basic problem in high-speed switching. Such a problem corresponds to a problem that a fire engine takes a lot of time to arrive at the scene of fire; if a fireplug is prepared at the fire site in the event of a fire, people can respond quickly in the fire by using the fireplug.

This corresponds to that an electronic circuit can cope with the problem if the power/ground connecting portion of a transistor sending a signal has a storage of enough charges to fill a load capacitor of the transistor, namely, a bypass capacitor (also may referred to as a decoupling capacitor). The amount of charges in the storage only need to be an amount to involve just a voltage drop of the minimum potential ensuring the transistor operation. It is like the event of a fire only requiring sufficient water or extinguishant for an early extinction of flame.

In the electronic circuit, if a voltage dr p within 20% is permitted, for example, assuming 5 fF as a total of the stored charge amount of the transmission transistor and the parasitic capacitance and 5 fF as that defined in the same manner for the signal reception transistor, and 10 fF as a wiring capacitance connecting therebetween, the transmission transistor power/ground connecting portion only need have a bypass capacitor of 20 fF/0.2=100 fF=0.1 pF (in the strict sense it means that the wiring length is physically zero) in view of the relation of Q=CV.

According to the present invention, an arrangement and a structure of the bypass capacitor are suggested for a charge supply to the reception transistor as a load and to a load of the transmission line connecting thereto on the basis of the above-mentioned principle. Further, it is important that a power transmission pipe connecting to a signal generation transistor (driver) through the bypass capacitor from an external power supply is thicker than a transmission line (branch line) for transmitting a signal, which has already been described in detail in the earlier cited reference 1. While the following describes the circuit structure of the present invention with acceptance on the structure described in the cited reference 1, the present invention is not necessarily limited to such a structure.

Subsequently, the principle of the present invention in the above will be described further in detail with reference to the accompanying drawings.

First, referring to FIG. 1, description will be made about a transient response of the driver circuit made by the transistor. When an ideal MOS transistor Q1 is turned on with an ideal input signal here, on-state current $I_Q=V_{dd}/R_{on}$ flows. The premise is generated when the power supply can supply charges equivalent to the current instantly. Assuming that there is no transistor switching delay, in another moment the current runs into a transmission line and receives a resistance equivalent to its characteristic impedance.

An equivalent circuit in this condition is shown at the middle stage in FIG. 1. At this moment, the on-state current $I_T=V_{dd}/(R_{on}+Z_0)$ flows. The current $I_0$ is generally ignored and it is called into question whether the power source can supply the charges of the $I_T$ flow. The current defines a distance of the charges and the charge amount is Q=I×t. Although it is difficult to define a space charge density, a spatial charge density at each place corresponds to a voltage at the place. It will be clear according to the image that $V_{dd}$ is not assured at each place. Assuming that the power supply is ideal and such a condition continues during $t_{pd}$, the charge amount of the transmission line is represented by $Q_T=I_T \times t_{pd}$.

Thereafter, the current $I_T$ is given a new load $R_L$. The transmission line completes to be charged and therefore it does not become a load, but an equivalent circuit at the bottom stage in FIG. 1. In other words, $I_T=V_{dd}/(R_{on}+R_L)$. The moment the current flowing in $I_T$ runs into a load, it becomes $I_l$. In this case, if $I_T>I_l$, the charges directly reflect and return to the transmission line. If $I_T<I_l$, a negative reflection is observed.

After an elapse of time $2t_{pd}$, the power supply is affected by the reflection. This problem, however, is not described here because the object of the present invention is absolutely to solve the problem in the initial state, that is, the transient state. However, it is pointed out here that improving the first problem leads to improving a secondary problem, which leads to increasing a design margin for a circuit layout as a result.

In the electronic circuit illustrated in FIG. 1, the change of state described above occurs at a light speed. The conventional transistor switching speed is too low relative to the light speed of the length of the transmission line and it is like the come and go of the tide, and therefore the problem of the time lag as shown in FIG. 1 has not been aware of.

Figure 2:
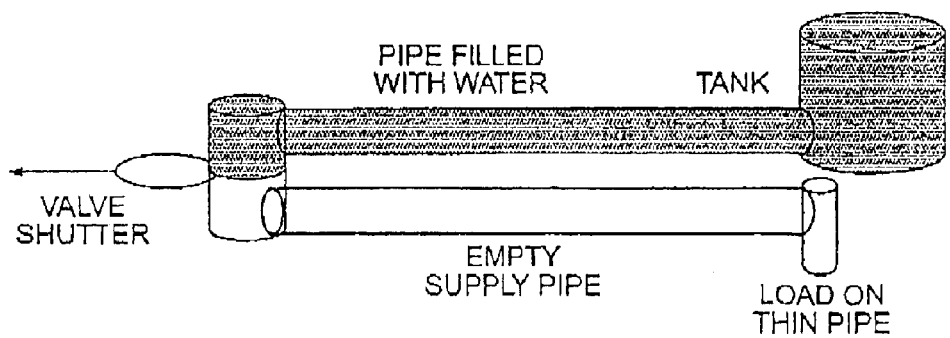
FIG. 2 is a diagram for figuratively explaining the principle of the present invention by using a water pipeline model.

Next, in order to simplify an understanding of the present invention, the invention will be described with reference to FIG. 2 for figuratively explaining the change state of the charge density. Referring to FIG. 2, a pipeline is assumed in which a large tank filled with water connects to a valve through a pipe and an empty pipe passes under the valve to be connected to a load pipe. If the tank shown in FIG. 2 is associated with a power supply, the pipe connecting to the tank, the valve shutter, the empty supply pipe, and the thin pipe load can be associated With the power supply wiring, the transistor gate, the signal wiring, and the load, respectively, in the circuit shown in FIG. 1. The shaded part in FIG. 2 shows that the corresponding portion is filled with water and the water reaches up to just above the valve.

Figure 3:
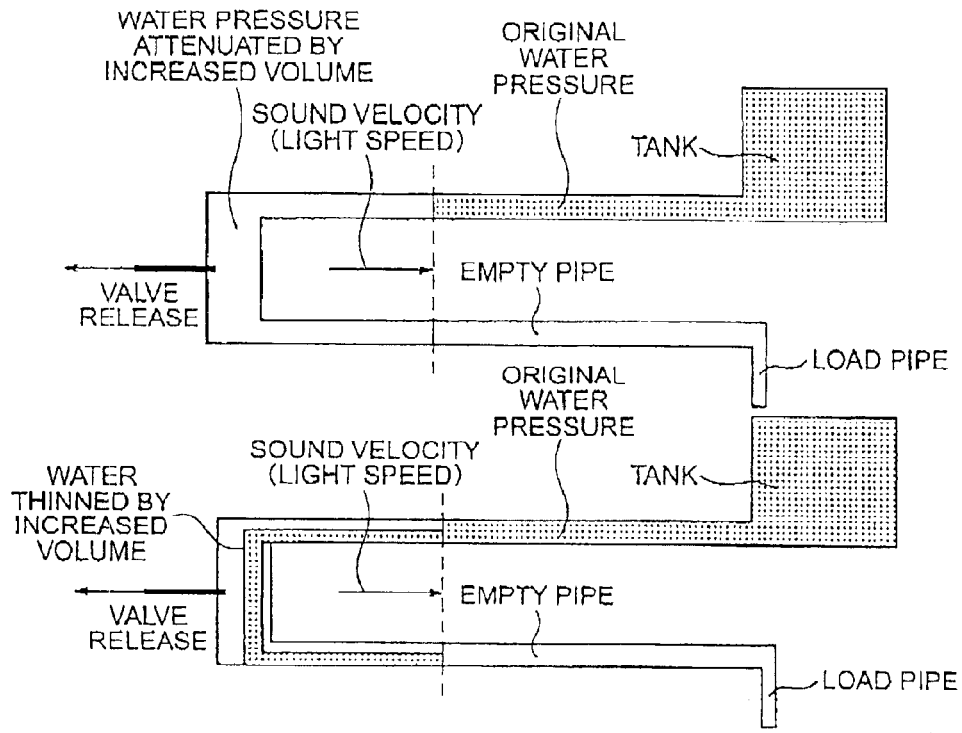
FIG. 3 is a diagram for explaining in more detail an operation in the system shown in FIG. 2.

When it is assumed that the power line has the same pipe thickness, namely, the same characteristic impedance as for the signal line, the concept is as shown in FIG. 3. Referring to FIG. 3, the following describes a phenomenon that occurs at the moment the valve is released when a water source pipe has the same thickness as for a supply pipe.

As shown in FIG. 3, the water up to just above the valve of the water source pipe runs down to below the valve as shown at the uppermost stage in FIG. 3 at the moment the valve is released, Even if the problem of gravity is ignored, the water is spreading out to the space of water pressure 0. The water pressure just above the valve naturally drops. Although information of the dropped water pressure is transmitted to the tank at a pressure transmission speed, it takes a long time because the water source pipe is long, The pressure transmission speed is equal to the sound velocity. In the case of water, the speed is approximately 1000 m/s. In order to compensate for the volume decrease of the pipe during the time, the water in the target part requires cubical expansion. Specifically, the water pressure of the corresponding part decreases. Since the upper pipe has the same thickness as for the lower pipe, the volume is just doubled. Water does not expand almost at all like a solid. Therefore, as shown at the lowermost stage in FIG. 3, the water flow has a low density equivalent to a half of the cross section of the pipe.

In the meantime, quite the same phenomenon occurs in the electronic circuit shown in FIG. 1. The electron density can be changed indefinitely (like air). Therefore, the phenomenon can be described referring to the concept diagram shown at the uppermost stage in FIG. 3 only if it is taken into account that the transmission speed is the light speed. Naturally, the electron density, namely, the voltage attenuated to a half is (½) $V_{dd}$. Although the on-state current $I_T=V_{dd}/(R_{on}+Z_0)$ is expected based on the transistor characteristic, only the current of (½)$I_T$=(½)$V_{dd}/(R_{on}+Z_0)$ flows during the time up to $2t_{pd}$. Herein, it is to be noted that the power supply wiring has the same length and characteristic impedance as for the signal wiring. If $t_{pd}$ of the line is 1 ns, 1 Hz clock (the ON time is 0.5 ns or shorter) is achieved. As apparent from the above, there is only a need for increasing the thickness of the pipe of the power supply wiring, in other words, for lowering the characteristic impedance.

This is the principle for achieving the first and second effects described in Japanese Patent Application No. 350904 of 2000 (hereinafter, will be referred to as cited reference 2). Since the present invention also assumes the basic configuration, the concept is shown in FIG. 4 again.

Figure 4:
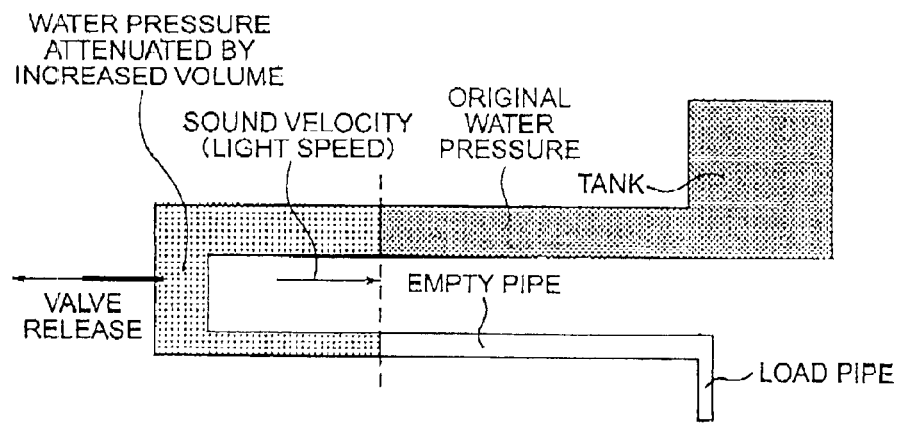
FIG. 4 is a diagram for explaining an operation in a model modified based on the model in FIG. 2.

Considering the electronic circuit referring to FIG. 4, the voltage less decreases as less volume is attenuated. For example, if it is assumed that the characteristic impedance of the power supply wiring is 10 Ω and that of the signal wiring is 50 Ω, the voltage reduction at transistor on-resistance 10 Ω is:

$$((50+10)/(10+10+50))V_{dd}=0.857V_{dd}$$

Figure 5:
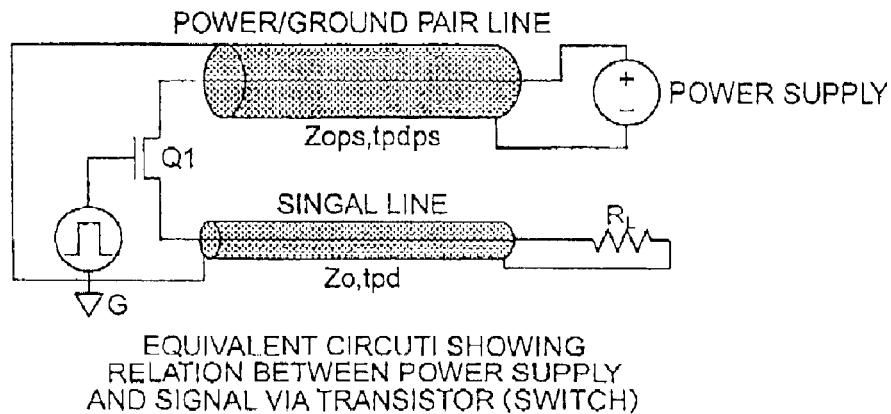
FIG. 5 is a diagram for equivalently explaining an electronic circuit corresponding to the model shown in FIG. 4.

It is shown as a simple example in FIG. 5. In FIG. 5, a pair of the power line and the ground line is shown as a power/ground pair line, which is represented by a cylindrical form indicating a distributed element circuit, though actually it has a power supply and ground distribution pattern arranged on a chip. The shown power/ground pair line is assumed to have characteristic impedance $Z_{Ops}$ and a transmission delay $t_{pdps}$. In the same manner, the signal line is also shown as a distributed element circuit, which is assumed to have characteristic impedance $Z_0$ and a transmission delay $t_{pd}$.

Referring to FIG. 5, current flows through the characteristic impedance $Z_{Ops}$ of the power/ground pair line introduced from the power source. Therefore, a voltage drop of $V_{dd} \times (R_{on}+Z_0)/(R_{on}+Z_0+Z_{Ops})$ on the signal line occurs only during the time of the transmission delay $t_{pdps}$ due to the length of the power/ground pair line. The time will now be defined more accurately. Assuming that t is the time when the voltage drop occurs, if $t_{pd} \geq t_{pdps}$, the voltage drops during the time satisfying $0 < t < t_{pdps}$. If $t_{pd} \leq t_{pdps}$, the voltage drops during the time satisfying $0 < t < t_{pd}$. If the delay time satisfies tpd<t<tpdps, which is lower than tpdps, the voltage drop changes to $V_{dd} \times (R_{on}+R_L)/(R_{on}+R_L+Z_{Ops})$.

Although there is an operation time for compensating for a voltage drop on the power/ground pair line sensed by the power supply and there is further a voltage variation subsequently, the description of the subsequent voltage variation will be omitted here because the present invention is related to improving the initial state.

If it is assumed that the characteristic impedance of the power/ground pair line is the same as that of the signal line and that the on-resistance of the transistor is negligible in comparison with its characteristic impedance, an amplitude of (½) $V_{dd}$ first flows to a receiver end. If the receiver-end has a capacitance of several fF at a CMOS gate, it is considered to be almost an open end and the signal energy totally reflects. It causes a voltage sensed by the CMOS gate to be (½)×2 $V_{dd}$=$V_{dd}$. Consequently, the signal sent to the gate becomes normal and it is transmitted only with a transmission line delay of the signal transmission line.

If several signal lines are supplied in a form of a single power/ground pair line, the characteristic impedance of the power/ground pair line is equal to or lower than that of 1/the number of the signal lines, namely, preferably $Z_{Ops} \leq Z_0/N$ (where N is the number of shared signal lines). This is also the second condition described in the cited reference 2.

Even if it is supposed, the problem of the power/ground fluctuation still exists and the following various problems involving a transistor switching delay are not resolved.

The first problem is that a necessary charge cannot be supplied to a load existing beyond an output signal and the present invention provides means for solving the problem. As an example of supplying the charge to the load, theremare a charge-up for a signal line and a charge-up for a gate capacitor of the receiver as already described. While lower power/ground characteristic impedance enables taking more rapid charge-up, a charge supply cannot really be expected from a distant power supply and further an opposite transition time starts during the time. In conventional products, a bypass capacitor is placed as close to the load as possible to cope with the problem and a bypass capacitor is often incorporated into a chip (Intel Pentium (registered trademark) II, Pentium (registered trademark) III, and Pentium (registered trademark) 4, for example).

In the conventional products, however, the power/ground is not handled as a line adequately and therefore a parasitic inductance ($L_c$) is high in spite of short wiring, by which the problem is not fully resolved (the bypass capacitor should be 100 μm or lower of a gate in the publication of the Pentium (registered trademark) III).

Figure 6:
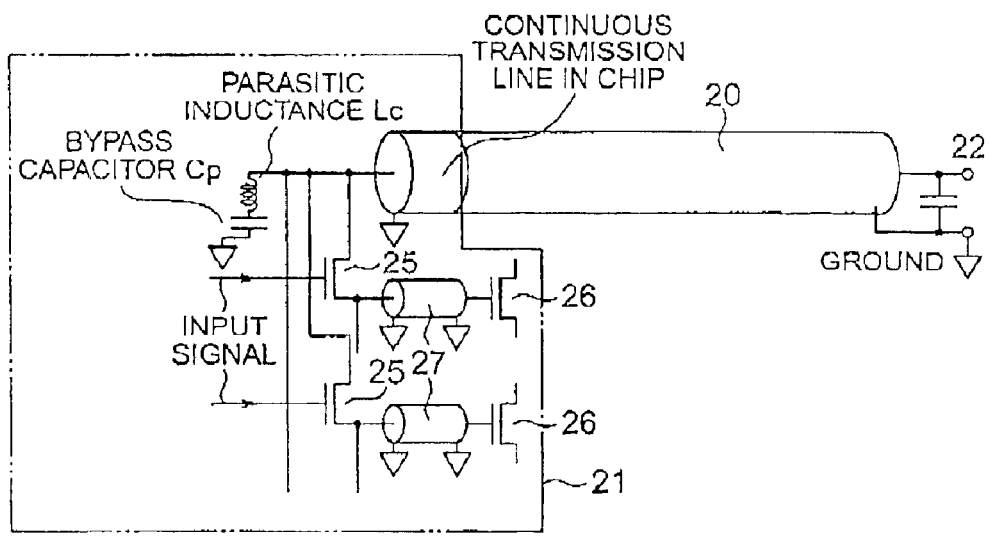
FIG. 6 is a circuit diagram for conceptually explaining the present invention.

According to the present invention, it is found that incorporating a transmission line into a chip is very effective when the parasitic inductance is also considered, Referring to FIG. 6, there is shown a conceptual structure of the present invention. From the diagram, it is apparent that more effective intra-chip bypass capacitor ($C_p$) embedded structure issued in addition to employing a transmission line of the power/ground pair.

More specifically, the circuit structure shown in FIG. 6 includes a power/ground pair transmission line 20 and a chip 21. One end of the power/ground pair transmission line 20 is connected to a power supply 22 while the other end is arranged in the chip 21. The illustrated power line of the power/ground pair transmission line 20 is connected to a plurality of driver circuits 25 operating in response to an input signal in the chip 21. Further, the chip 21 is provided with a plurality of receiver circuits 26 in addition to the driver circuits 25. The driver circuits 25 and the receiver circuits 26 are connected to each other via an intra-chip signal transmission line 27, respectively.

In this example, it is assumed that N intra-chip signal transmission lines 27 are arranged and that each transmission line has characteristic impedance $Z_0$ and a transmission delay $t_{pd}$. In the meantime, it is assumed that the power/ground pair transmission line 20 has characteristic impedance $Z_{Ops}$ and a transmission delay $t_{pdps}$ and that characteristic impedance $Z_{Ops}$ of the power/ground pair transmission line 20 is preset so as not to be higher than a(1/N)$Z_0$ (where a is a coefficient equivalent to an execution access determined taking into consideration that N intra-chip signal transmission lines 27 are not accessed simultaneously and a<1).

Moreover, it is assumed that the power/ground pair transmission lien 20 in the chip 21 is connected to the bypass capacitor $C_p$ as described above and that the power/ground pair transmission line 20 involves a parasitic inductance $L_c$.

Hereinafter, a simulation is carried out with variables of the characteristic impedance $Z_{Ops}$ and $Z_0$ of the power/ground pair transmission line 20 and the signal line 27. In this event, it is assumed that a transistor of the driver circuit 25 and of the receiver circuit 26 comprises an MOS transistor and that the on-resistance of a transistor in the transmission side, in other words, in the driver circuit 25 is $R_{on}$=L/12 kW ($V_G$-|$V_T$|)=120 Ω and the gate capacitance $C_{ox}$=b $\in_{ox}$LW/$t_{ox}$ is 5 fF.

In this case, L, W, $t_{ox}$, $\in_{ox}$, k, b, $V_G$, $V_{DD}$, and $V_T$ are a gate length (0.18 μm), a gate width (0.5 μm), an effective gate oxide film thickness (0.0015 μm) a dielectric constant of SiO$_2$ (4×8.854×10$^{-12}$ F/m), a gain element (0.001) of a transistor, a gate effective area ratio (=2.3) to a parasitic capacitance, a gate voltage (0.5 V), 1.5 V, and a threshold voltage (0.25 V in a receiver), respectively.

Figure 7:
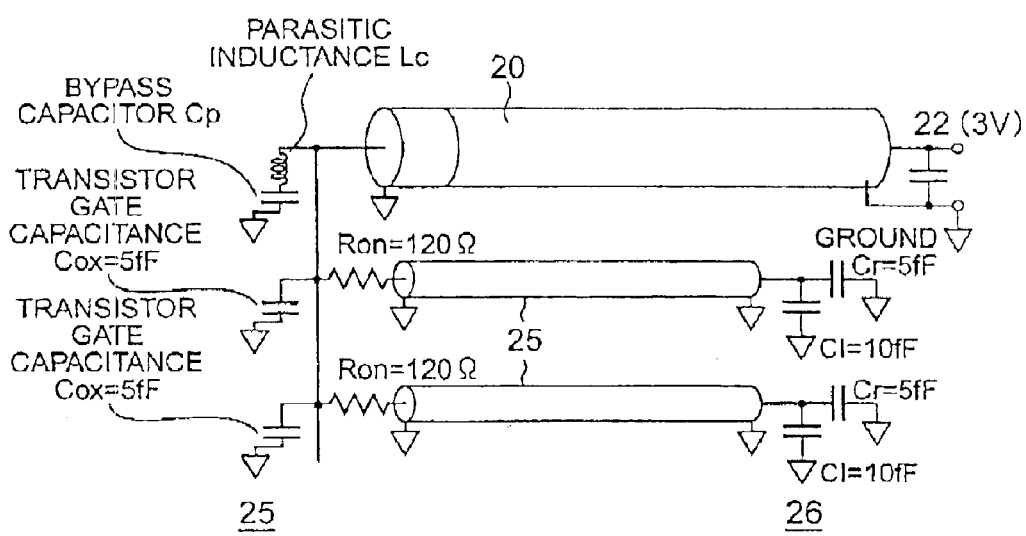
FIG. 7 is an equivalent circuit diagram of the circuit diagram shown in FIG. 6.

Assuming that the signal transition time is 25 ps, that a delay time of a signal line is negligible, and that the parasitic capacitance of a line $C_1$ is 10 fF and the gate capacitance of a receiver $C_r$ is 5 fF, the equivalent circuit in FIG. 6 is as shown in FIG. 7.

With varying the characteristic impedance $Z_{Ops}$ and $Z_0$ of the power/ground pair transmission line 20 and the signal line 27 on the basis of the equivalent circuit shown in FIG. 7, the whole concept of an essential structure is defined here based on the result of the simulation. Table 1 indicates simulation conditions.

TABLE 1

Simulation conditions

|  | $Z_{Ops}$ | $Z_0$ (for two lines) | $L_c$ | $C_p$ |
|---|---|---|---|---|
| Cond. 1 | 100 Ω | 25 Ω | 5 nH | 60 fF |
| Cond. 2 | 100 Ω | 25 Ω | 0.01 nH | 60 fF |
| Cond. 3 | 5 Ω | 25 Ω | 5 nH | 60 fF |
| Cond. 4 | 5 Ω | 25 Ω | 0.01 nH | 60 fF |

The conditions 1 and 2 are used when the characteristic impedance $Z_{Ops}$ of the power/ground pair transmission line 20 is higher than the characteristic impedance $Z_0$ of two intra-chip signal transmission lines 25. On the other hand, the conditions 3 and 4 are used when the characteristic impedance $Z_{Ops}$ of the power/ground pair transmission line 20 is lower than the characteristic impedance $Z_0$ of the two intra-chip signal transmission lines 25. As apparent from them, the conditions 3 and 4 satisfy the prerequisite of the present invention. On the other hand, the condition 2 satisfies the prerequisite of the present invention regarding the parasitic capacitance $L_c$.

Figure 8:
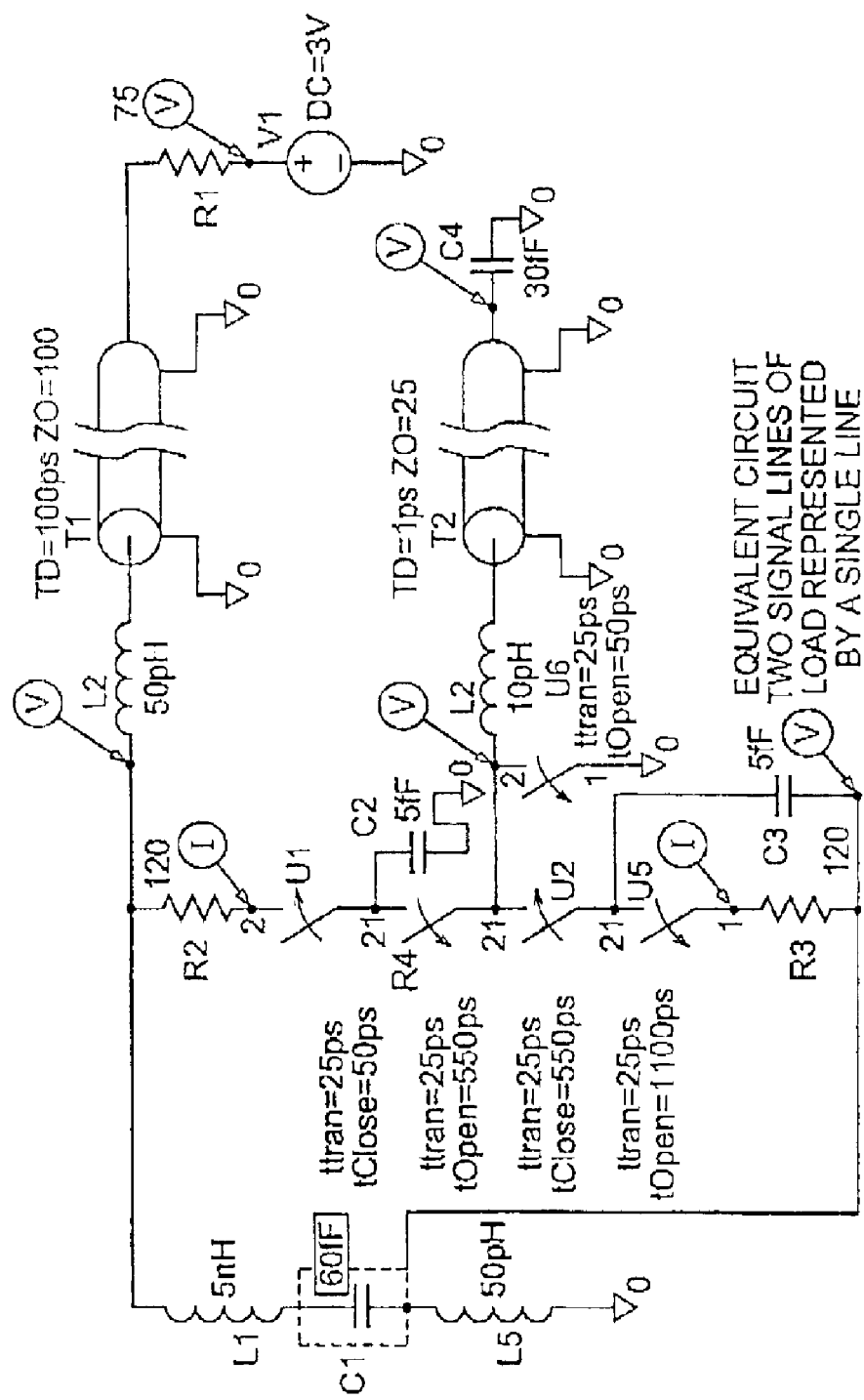
FIG. 8 is a an equivalent circuit diagram more specifically showing the equivalent circuit diagram shown in FIG. 7.

Referring to FIG. 8, a specific circuit structure used for the simulation is illustrated. Here, two signal transmission lines are represented by a single transmission line. As apparent from a comparison between FIG. 7 and FIG. 8, the bypass capacitor $C_p$ is set to 60 fF to vary its parasitic inductance $L_c$ in FIG. 8.

Figure 9:
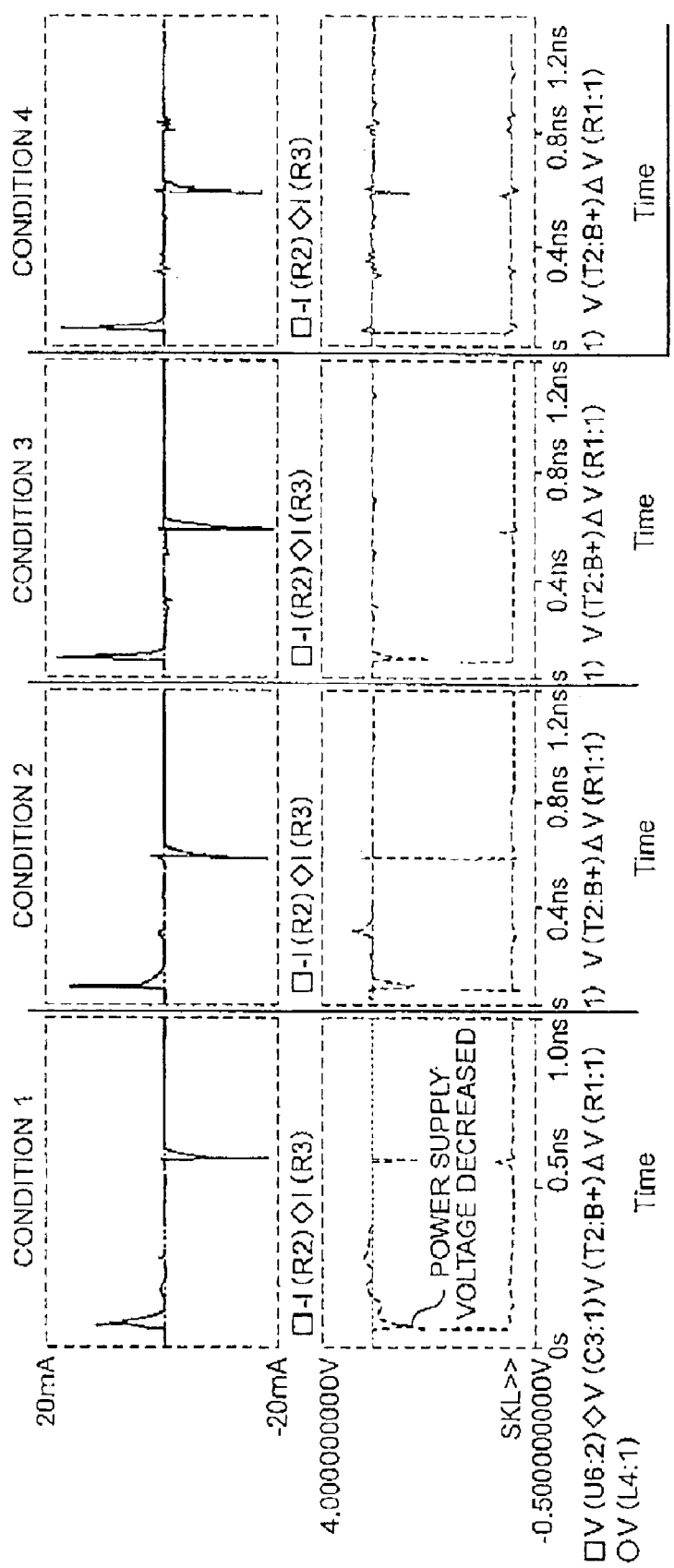
FIG. 9 is a diagram showing a result of simulation in the circuit shown in FIG. 8.

FIG. 9 shows a result of a simulation in the circuit structure shown in FIG. 8 under the conditions 1, 2, 3, and 4 listed in Table 1. In FIG. 9, current variations at the upper stage and voltage variations at the lower stage are shown, respectively. Although a little resonance is observed also under the conditions 3 and 4 in the current and the voltage as shown in FIG. 9, this level of resonance energy is actually absorbed by an inserted wiring resistance. Since ground fluctuations cannot be simulated with the circuit simulation, attention is paid to supply voltage drops. An output result shown in FIG. 9 is summarized in Table 2. The conditions are favorable in the following order: condition 4, condition 3, condition 2, and condition 1.

It proves that the characteristic impedance of the power/ground pair line is favorably lower than the characteristic impedance $Z_{Ops}$ of the load line and that the inductance $L_c$ parasitic on the bypass capacitor is favorably low.

TABLE 2

Summary of Simulation Result

|  | Supply voltage drop (Max. value) | 0–90% rise time |
|---|---|---|
| Cond. 1 | 1.12 V | 45.0 ps |
| Cond. 2 | 0.89 V | 44.0 ps |
| Cond. 3 | 0.30 V | 25.0 ps |
| Cond. 4 | 0.21 V | 24.25 ps |

As apparent from Table 2, 25 ps or lower is observed at an input rise of the simulation under the condition 3 or 4 and the pulse-equivalent frequency f is 0.35/25 ps=14 GHz. This result shows that the switching at 14 GHz is practically possible and that it is much superior to the result achieved by the current technology, by which the present invention is apparently very effective in a high-speed operation.

In addition, as in the condition 2, the characteristic is improved by decreasing the inductance $L_c$ of the bypass capacitor $C_p$. Therefore, suggestion is also made about a structure for decreasing the inductance $L_c$ of the bypass capacitor $C_p$ according to the present invention.

Although the transmission delay of the power/ground pair line is assumed to be 100 ps in the equivalent circuit shown in FIG. 8, this transmission delay is equivalent to 15 mm of wiring length of a line having an insulator of dielectric constant 4. Just by arranging a bypass capacitor in the vicinity of an LSI package pin, it can serve as a power supply in this case.

Referring to FIG. 8, there is shown a preferable power line with only 50 pH of parasitic inductance assuming wiring from the bypass capacitor to the transistor via a transmission line. The same is true in the ground. The capacitance $C_p$ of 60 fF of the bypass capacitor, which is twice the load capacitance $C_1$, is attached to two sets of drivers and its extremely high parasitic inductance of 5 nH and 10 pH achievable in this suggestion are applied to observe the effects. For the transmission line, 5 Ω to be a setting value in this suggestion and 100 Ω to be observed when so much consideration is not given as a transmission line are assumed. Naturally, in the case of 100 Ω, the parasitic inductance is not low such as 50 pH, but is put in a terrible state of several nH. The low parasitic inductance, however, is used directly for a comparison. An increase of the parasitic inductance of the power/ground accelerates a delay of the power supply time. Thereby, the effect of the bypass capacitor $C_p$ is increased. According to the present invention, it is also cleared that the low parasitic inductance of the bypass capacitor (the conditions 2 and 4) is effective so as to cope with the situation.

Totally describing the simulation result in the above, it is found that the bypass capacitor is embedded in the power/ground wiring portion just before the branch to the unit circuit group and the capacitance of the bypass capacitor $C_p$ is equal to or lower than (the receiving end gate capacitance+its wiring capacitance)/the number of units) in the semiconductor integrated circuit comprising a unit circuit (a memory unit and a logical gate) group including transistors. More specifically, when a single bypass capacitor is embedded in the unit circuit group, the capacitance $C_p$ is increased according to the number of units N and it is effective to set so as to satisfy the following expression:

$$C_p \leq a \times N \times (b+c)$$

where b is the receiving end gate capacitance, c is its wiring capacitance, and a is a coefficient corresponding to an execution access (a<1)). In FIG. 8, b is 5 fF and c is 10 fF. Herein, it is to be noted that N is preferably selected within a range between 1 and 10. In addition, the bypass capacitor function is equally achieved by broadening a part of the power/ground wiring portion as described later and therefore it is not necessary to arrange the bypass capacitor in a positive manner.

As a supply wiring method of the power/ground into the chip, a so-called coplanar waveguide is adopted as a transmission line. For example, in the Intel Pentium (registered trademark) II chip manufactured in the 0.25 μm process, the fifth layer (the uppermost layer) power/ground wiring has a 2.56 μm pitch widely. This line, however, is problematic in that it is impractical in size to lower the characteristic impedance of the power/ground wiring to less than 50 Ω.

Figure 10:
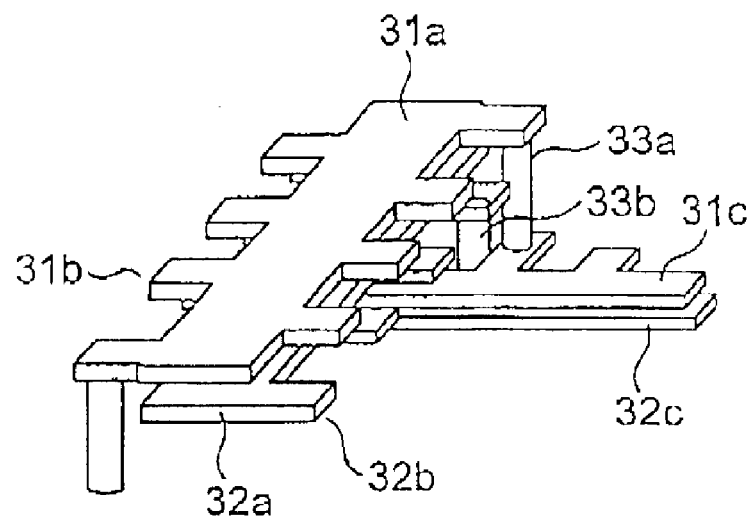
FIG. 10 is a stereoscopic wiring diagram for explaining a circuit structure according to an embodiment of the present invention.

Under such a circumstance, the present invention employs a structure in which a stacked pair line as shown in FIG. 10 is used to increase the line capacity, thereby decreasing the characteristic impedance to less than 50 Ω.

Referring to FIG. 10, the structure of the stacked pair line according to the present invention will be described more specifically. The shown example shows an arrangement of the power/ground pairs in a plurality of layers. Here, components, substrates other than the power/ground pairs are omitted for simplification. A broad power line 31a is placed in the uppermost layer in FIG. 10 and a plurality of narrow power lines 31b are arranged on either side of the power line 31a. Additionally, a broad ground line 32a like the power line 31a is located on the underside of the power line 31a so as to be opposite to the power line 31a, in other words, so that they are stacked. A plurality of narrow ground lines 32b are arranged also on either side of the ground line 32a and these ground lines 32b are placed opposite to the upper power lines 31b.

In the illustrated example, the power line 31a is electrically connected to a power layer 31c arranged in the layer under the ground line 32a via a plug 33a. The underside power layer 31c is narrower than the power line 31a. On the other hand, the ground layer 32a is also electrically connected to an underside ground layer 32c arranged in the layer under the power layer 31c via a plug 33b and the underside ground layer 32c is placed opposite to the underside power layer 31c.

In this manner, the capacitance of the power/ground pairs can be increased by using the broad power layers and using the stacked layer structure of the power and ground lines. Thereby, the characteristic impedance needed for the power/ground pairs can be realized.

If the above layer structure causes a loss due to a phase lag and a long approach is needed even in the intra-chip stacked pair line, the bypass capacitor is as close to the transistor as possible and therefore it is ideally embedded in the chip.

Although the total number of lines increases when stacked pair lines are used, the supply energy increases as described above. Therefore, a single pair layer or two pair layers at the maximum is satisfactory.

Figure 11:
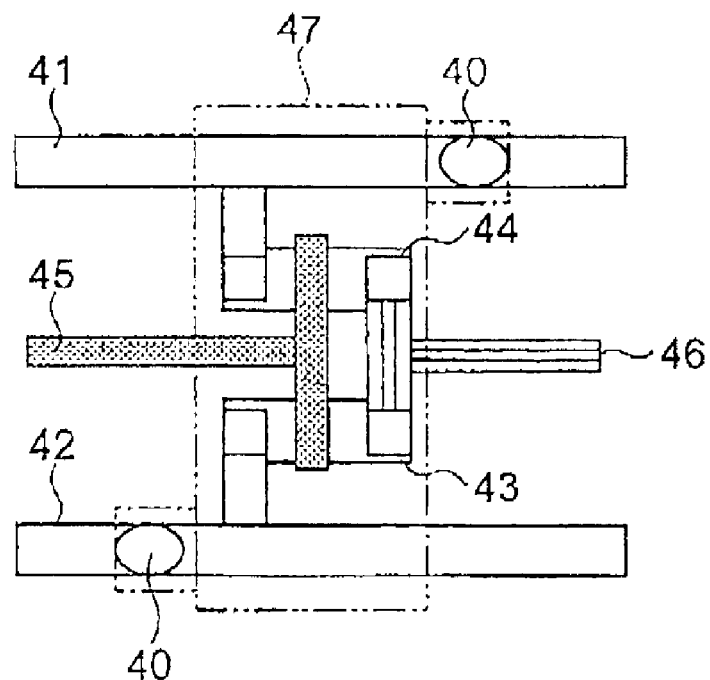
FIG. 11 is a plan view showing a circuit structure according to another embodiment of the present invention.

Referring to FIG. 11, the circuit structure according to another embodiment of the present invention can achieve a desired capacitance with a connection to the power/ground wiring via a plug 40 like the lowermost plug 33b in the hierarchical structure shown in FIG. 10. Specifically, the circuit structure shown in FIG. 11 comprises a power line 41 on a chip and a ground line 42 spaced apart two-dimensionally from the power line 41.

An inverter comprising NMOS 43 and PMOS 44 is formed in a chip region between the power line 41 and the ground line 42. A source of the NMOS 43 is connected to the ground line 42, while a source of the PMOS 44 is connected to the power line 41. Gates of the NMOS 41 and the PMOS 42 are commonly connected to an input terminal 45 and a drain of the NMOS 41 and a drain of the PMOS 42 are electrically connected to an output terminal 46. Although a single inverter is illustrated in this example, a large number of devices (not shown) are generally integrated with an inverter in a semiconductor integrated circuit.

Moreover, the power line 41 and the ground line 42 are formed in a multilayer structure in the same manner as in FIG. 10 and the shown power line 41 and ground line 42 are stacked on a ground line and a power line on another layer in the stacked structure. The power line 41 and the ground line 42 are electrically connected to the ground line and the power line on another layer via a plug 40.

In the illustrated example, the ground line or the power line on another layer is provided with a broad electrode portion 47 as indicated by a chain double-dashed line and the circuit is configured so that a desired capacitance is obtained from the electrode portion 47. As apparent therefrom, the shown configuration enables the desired capacitance to be achieved only by the electrode portion 47. By arranging the electrode portion 47 also in other units, it becomes possible to achieve the characteristic impedance of the power/ground pair described with reference to FIG. 6.

Figure 12:
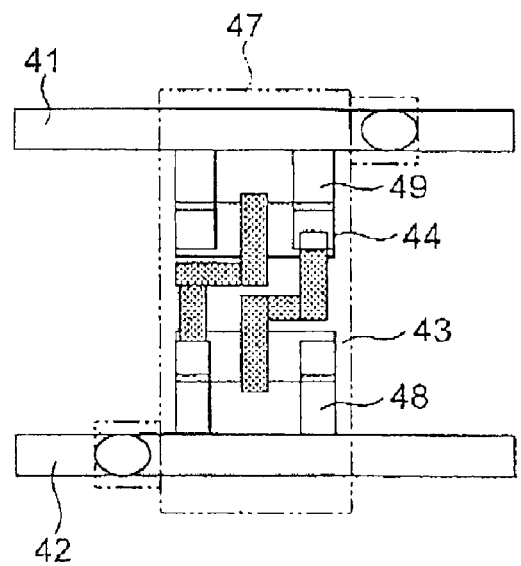
FIG. 12 is a circuit structure according to still another embodiment of the present invention, showing an alteration of the circuit structure shown in FIG. 11 here.

Referring to FIG. 12, a capacitor is formed with the NMOS 41 and the PMOS 42 shown in FIG. 11. The capacitor is configured so as to obtain a large capacity by connecting a drain of the NMOS 43 and a source of the PMOS 44 to the ground line 42 and the power line 41 via diffusion layers 48 and 49, respectively. A gate and the source of the PMOS 44 are connected to a source and a gate of the NMOS 43, respectively Thus, the desired capacity and characteristic impedance can be also obtained by arranging a bypass capacitor having a specially designed gate capacity.

Figure 13:
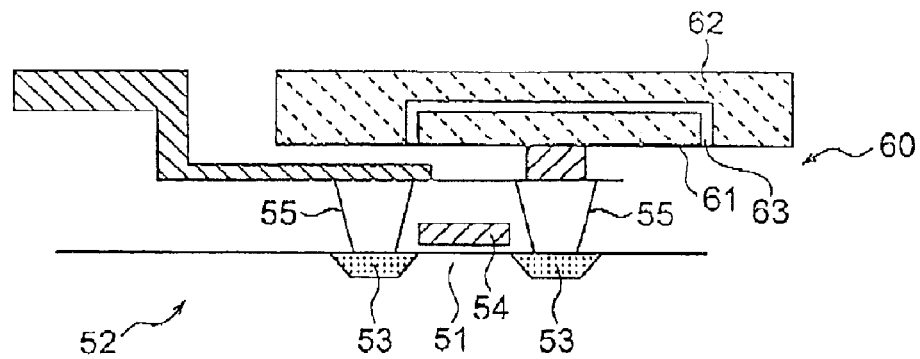
FIG. 13 is a diagram showing a circuit structure according to further another embodiment of the present invention.

Referring to FIG. 13, there is shown an example of a circuit structure according to still another embodiment of the present invention using a capacitor for use in a DRAM as a bypass capacitor. Specifically, an access transistor 51 always kept in the ON state is arranged in a P-type substrate 52. The access transistor 51 has two N-type diffusion regions 53 and a gate electrode 54 located in a gate region, and the gate electrode 54 is connected to a word line. In this example, it is assumed that the word line is always given a signal causing the access transistor 51 to be turned on.

Moreover, the respective diffusion regions 53 are provided with plugs 55 and 56, the plug 55 is connected to a bit line 57, and the bit line 57 is electrically connected to an upper layer, namely, a power layer.

In the meantime, the plug 57 is connected to a bypass capacitor 60 having the same structure as for a DRAM capacitor. The bypass capacitor 60 comprises a lower electrode 61, an upper electrode 62, and a high-dielectric material layer 63 arranged therebetween.

Figure 14:
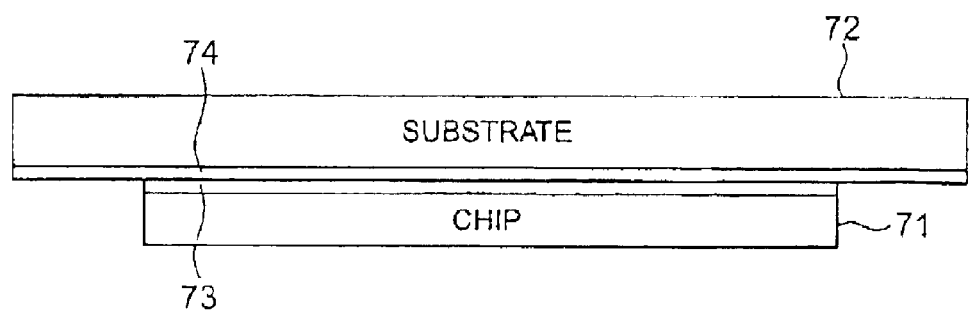
FIG. 14 is a diagram showing a connection method for use in forming a circuit structure according to still another embodiment of the present invention.

Referring to FIG. 14, description will be made about a circuit structure according to still another embodiment of the present invention. In the illustrated example, a semiconductor chip 71 is connected to a substrate 72 with a capacitor portion embedded using a bumpless superconnect technology. In this case, a chip active layer and a wiring layer 73 are formed on the chip 71, while a substrate wiring portion and a capacitor portion 74 are arranged on the substrate 72. The bumpless superconnect technology for connecting the chip 71 to the substrate 72 is not described here because it is already described in Japanese Unexamined Patent Publication (JP-A) No, 2000-299379. It has already been confirmed that more favorable simulation result is achieved by inserting a resistor into the chip 71 or the substrate 72 in the shown structure. In this event, the resistor may be a semiconductor resistor such as a gate channel resistor and a diffusion layer resistor or may be a thin-film resistor.

Figure 15:
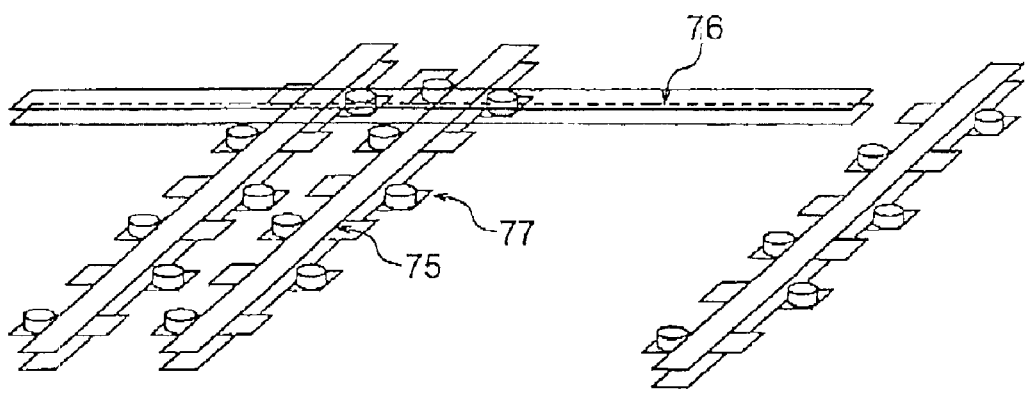
FIG. 15 is a diagram showing an example of the wiring structure in which the connection method shown in FIG. 14 is employed for the connection.

Referring to FIG. 15, the structure in FIG. 14 is illustrated in more detail. In the illustrated example, a stacked pair line 75 is arranged in the side of the chip 71, while a stacked pair line 76 is also arranged in the side of the substrate 72. The stacked pair lines 75 and 76 form the power/ground pair line described above. In the illustrated example, the stacked pair lines 75 and 76 are arranged so as to cross at right angles and they are connected to each other via a plug 77 by the bumpless superconnect technology.

Figure 16:
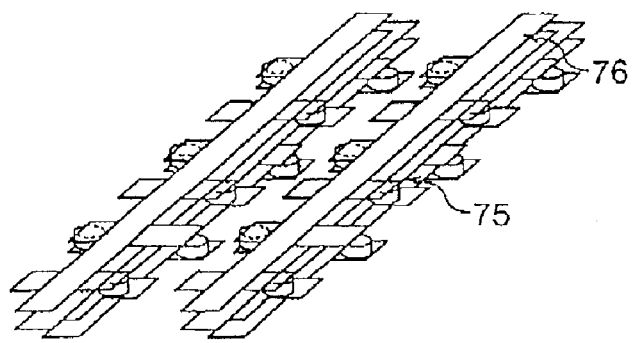
FIG. 16 is a diagram showing another example of a wiring structure in which the connection method shown in FIG. 14 is employed for the connection.

Referring to FIG. 16, there is shown the same structure as in FIG. 15 except that the stacked pair lines 75 and 76 are located so as to be vertically opposite to each other and that they are arranged in parallel.

Figure 17:
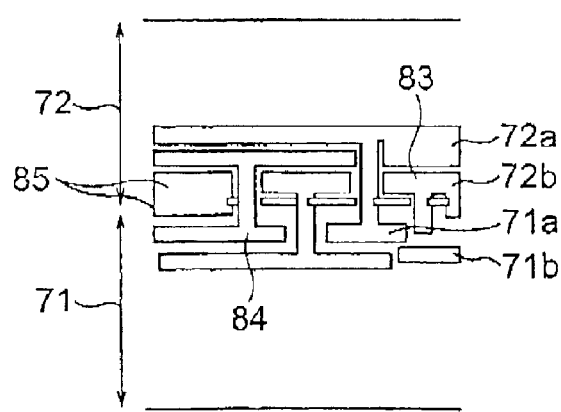
FIG. 17 is a diagram more specifically showing a chip and a substrate connected by using the above connection method.

With reference to FIG. 17, a sample cross section of the bumpless superconnection will be described below. In the chip 71, an intra-chip power line 71a and an intra-chip ground line 71b are wired in a form of a stacked pair. On the other hand, an intra-substrate power line 72a and an intra-substrate ground line 72b are arranged in the substrate 72. In this example, an embedded capacitor is arranged in a part of the power line 72*a* and that of the ground line 72*b* in the substrate 72 and in this relation a high-dielectric 83 is arranged between the part of the power line 72*a* and that of the ground line 72*b*. Further, each line in the chip 71 is connected to the power/ground stacked pair line in the substrate via a plug 84. Although the connection between them is continuously shown by the plug, the bumpless superconnect technology is used for the boundary connection between them and a dummy wiring layer 85 may be used to secure the connection in the area where the plug is not used, In addition, a plug is arranged in the plug and the capacitor in the substrate is connected by the plug. Although the high-dielectric 83 is used for the capacitor in order to decrease the opposing area in this example, naturally a normal dielectric capacitor may be used. Naturally, the dummy connection wiring 85 ay be used as a capacitor electrode in the structure.

As explained hereinabove, the power/ground pair layer in the uppermost layer comprises broad lines in a form of stripes under the electric energy control conditions independently of the miniaturization in the manufacturing process. The wiring pitch is several $\mu$m. If external connection pads corresponding to the pitch are formed as shown in FIGS. 15 and 16, the same effect is obtained by embedding a capacitor in a mounting substrate instead of arranging a bypass capacitor in a chip. In this event, the bumpless superconnect method is preferably used as described above. In either case, it is preferable to select a bump pitch or a plug pitch within a range of 2 to 10 $\mu$m. The bypass capacitor embedded in the substrate can be configured in the same manner as in a chip if it is an Si substrate. If it is an insulating substrate made of alumina, polyimide, or benzocyclobutane, all kinds of conventional capacitor configurations can be adopted such as, for example, a metal electrode capacitor or a multilayer capacitor.

Moreover, if a variable capacitor is arranged in the driver circuit, the bypass capacitor according to the present invention can be configured so as to be complementary in operation to the variable capacitor. More specifically, the complementary operation can be realized by using the bypass capacitor configured as shown in FIG. 12 and having the same size as the inverter.

While the present invention has thus far been disclosed in conjunction with several embodiments thereof, it will be readily possible for those skilled in the art to put the present invention into practice in various other manners.

What is claimed is:

1. A circuit structure including a driver circuit and a power/ground line structure in a chip, wherein:
    said power/ground line is connected to a capacitance element having a predetermined capacitance as a power-ground connection circuit so as to be adjacent to said driver circuit, and
    said predetermined capacitance is larger than a parasitic capacitance of said driver circuit.
2. The structure according to claim 1, wherein:
    said capacitance element comprises at least one of pn diffusion capacitor and electrode capacitor.
3. A circuit structure including a driver circuit and a power/ground line structure in a chip, wherein:
    said power/ground line is connected to a capacitance element having a predetermined capacitance as a power-ground connection circuit so as to be adjacent to said driver circuit, and
    said capacitance element is connected to said driver circuit so as to be complementary to the capacitance element of said driver circuit in operation.
4. The structure according to claim 3, wherein:
    said capacitance element comprises at least one of pn diffusion capacitor and electrode capacitor.
5. A circuit structure including a driver circuit and a power/ground line structure in a chip, wherein:
    said power/ground line is connected to a capacitance element having a predetermined capacitance as a power-ground connection circuit so as to be adjacent to said driver circuit, and
    said predetermined capacitance is equivalent to or larger than at least stored charges of the driver circuit or total parasitic capacitance of the circuit structure.
6. The structure according to claim 5, wherein:
    said capacitance element comprises at least one of pn diffusion capacitor and electrode capacitor.
7. A circuit structure including a driver circuit and a power/ground line structure in a chip, wherein:
    said power/ground line is connected to a capacitance element having a predetermined capacitance as a power-ground connection circuit so as to be adjacent to said driver circuit,
    the structure further comprising a configuration in which a unit circuit including a transistor is connected to said power/ground line in a chip,
    wherein characteristic impedance of said power/ground line is lower than characteristic impedance of a signal transmission line for sending a signal through said driver circuit.
8. A semiconductor integrated circuit, comprising:
    a unit circuit group which includes a plurality of unit circuits having transistors in a chip, and
    a power/ground wiring portion which supplies power to the unit circuit group and which is arranged in the chip,
    wherein said power/ground wiring portion has a capacitance adjustment portion in a position just before a branch of the unit circuit group, and
    said capacitance adjustment portion is a wiring portion configured such that the capacitance is larger than that of the unit circuit group.
9. The semiconductor integrated circuit according to claim 8, wherein:
    said power/ground wiring portion has at least one bypass capacitor.
10. The semiconductor integrated circuit according to claim 9, wherein:
    said bypass capacitor of said power/ground wiring portion is not larger than (receiving end gate capacitance+its wiring capacitance)/(the number of units).
11. The semiconductor integrated circuit according to claim 9, wherein:
    when a single bypass capacitor is embedded in the unit circuit group, capacitance $C_p$ thereof is expressed by the following on condition that N is the number of units:

$$C_p \leq a \times N \times \text{(receiving end gate capacitance+ wiring capacitance thereof))}$$

where a is a coefficient equivalent to an execution access determined on the ground that simultaneous access is not performed and a<1.
12. The semiconductor integrated circuit according to claim 11, wherein:
    the capacitance $C_p$ of said bypass capacitor is expressed by the following on condition that the receiving end gate capacitance is b fF and the wiring capacitance is c fF:

$$C_T \leq a \times N \times (b+c) fF$$

where the case of N=1 is included.

13. The semiconductor integrated circuit according to claim 11, wherein:

each of the units forming said unit circuit group is a memory including a plurality of storage memory cells.

14. The semiconductor integrated circuit according to claim 13, wherein:

the capacitance $C_p$ of said bypass capacitor is larger than a cell capacitance of each memory cell.

15. The semiconductor integrated circuit according to claim 14, wherein:

the number of units N is within a range of 1 to 10.

16. The semiconductor integrated circuit according to claim 14, wherein:

said bypass capacitor is arranged for every unit circuit or as many bypass capacitors as 1/(the number of said unit circuits) are arranged in a chip.

17. The semiconductor integrated circuit according to claim 15, wherein:

the capacitance $C_p$ of said bypass capacitor is selected so as to be several times larger than the cell capacitance of each memory cell.

18. The semiconductor integrated circuit according to claim 11, wherein:

fine connection pads are arranged on the whole area of the chip and are drawn out as power/ground pads alternately, while said bypass capacitor comprises capacitor groups made of the same semiconductor material in a bumpless flip chip connection and the capacitor groups are connected to said power/ground pads.

19. The semiconductor integrated circuit according to claim 18, wherein:

said fine connection pads are arranged in two lines around the chip and the pads form signal and ground pair pads.

20. The semiconductor integrated circuit according to claim 18, wherein:

the bumpless flip chip connection pitch is 10 μm or smaller.

21. The semiconductor integrated circuit according to claim 20, wherein:

said bumpless flip chips are arranged on almost whole area of the chip.

22. The semiconductor integrated circuit according to claim 18, wherein:

said pad has a signal pad connected to external wiring and to a driver circuit connected thereto for driving a load of a receiver of another chip, and the bypass capacitor connecting to the driver circuit connected through the signal pad is larger than the internal circuit capacitor.

23. The semiconductor integrated circuit according to claim 22, wherein:

said bypass capacitor is arranged in any one of a free space around the chip, a capacitor substrate, and an outer region of the signal pad.

24. The semiconductor integrated circuit according to claim 22, wherein:

said signal pad is not arranged in the central portion of the chip.

25. The semiconductor integrated circuit according to claim 18, wherein:

said capacitor is formed on a capacitor substrate made of different material from that of the chip.

26. The semiconductor integrated circuit according to claim 25, wherein:

said capacitor substrate is any one of an SOI capacitor substrate, a capacitor embedded ceramic substrate having almost the same area as for the intra-chip capacitor, and a capacitor embedded plastic thin-film wiring substrate.

27. The semiconductor integrated circuit according to claim 26, wherein:

said capacitor is formed as a larger capacitor by decreasing a degree of division.

28. The semiconductor integrated circuit according to claim 27, wherein:

said each capacitor is provided with more taking-out electrodes than the capacitors.

29. The semiconductor integrated circuit according to claim 27, wherein:

a direct current resistor is inserted just before an output transistor in order to reduce instant spike current due to a parasitic capacitance charge caused by a depletion layer of the output transistor.

30. The semiconductor integrated circuit according to claim 29, wherein:

the total of power/ground characteristic impedance and series resistance is equal to or smaller than signal line characteristic impedance.

* * * * *